(12) United States Patent
Balteanu et al.

(10) Patent No.: US 10,381,983 B2
(45) Date of Patent: Aug. 13, 2019

(54) ENVELOPE TRACKING FOR HIGH POWER AMPLIFIERS

(71) Applicant: SKYWORKS SOLUTIONS, INC., Woburn, MA (US)

(72) Inventors: Florinel G. Balteanu, Irvine, CA (US); Serge Francois Drogi, Flagstaff, AZ (US); Boshi Jin, Winchester, MA (US); Paul T. DiCarlo, Marlborough, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/811,394

(22) Filed: Nov. 13, 2017

(65) Prior Publication Data

US 2018/0138862 A1 May 17, 2018

Related U.S. Application Data

(60) Provisional application No. 62/421,076, filed on Nov. 11, 2016.

(51) Int. Cl.

| H03F 1/02 | (2006.01) |
|---|---|
| H04B 1/04 | (2006.01) |
| H03F 1/32 | (2006.01) |
| H03F 3/217 | (2006.01) |
| H03F 3/24 | (2006.01) |

(Continued)

(52) U.S. Cl.
CPC ........... *H03F 1/0227* (2013.01); *H03F 1/223* (2013.01); *H03F 1/32* (2013.01); *H03F 3/2176* (2013.01); *H03F 3/24* (2013.01); *H03F 3/245* (2013.01); *H03F 3/3022* (2013.01); *H03F 3/45206* (2013.01); *H04B 1/0483* (2013.01); *H03F 2200/102* (2013.01); *H03F 2200/451* (2013.01)

(58) Field of Classification Search
CPC combination set(s) only.
See application file for complete search history.

(56) References Cited

U.S. PATENT DOCUMENTS

| 2005/0242791 A1* | 11/2005 | Rajapandian | ............. G05F 1/46 323/268 |
|---|---|---|---|
| 2013/0057340 A1* | 3/2013 | Kunihiro | ............... H03F 1/0211 330/75 |

(Continued)

*Primary Examiner* — Junpeng Chen
(74) *Attorney, Agent, or Firm* — Chang & Hale LLP

(57) ABSTRACT

Disclosed herein are circuits, devices and methods that address challenges associated with power amplifier systems. A power amplifier system includes two or more fast error amplifiers coupled to corresponding power amplifiers. The fast error amplifiers are configured to generate envelope tracking signals based on a signal envelope, the envelope tracking signals modifying a DC-DC regulated voltage from a DC-DC converter to more efficiently operate the power amplifiers. By splitting the envelope tracking between two or more fast error amplifiers and amplification between corresponding two or more power amplifiers, the power, frequency or bandwidth, linearity, signal-to-noise ratio, efficiency, or the like of the power amplifier system can be improved. Wireless communications configurations with such power amplifier systems can provide uplink carrier aggregation and/or cellular signals based on standards and protocols that require increased bandwidth and/or power.

18 Claims, 14 Drawing Sheets

(51) Int. Cl.
*H03F 1/22* (2006.01)
*H03F 3/30* (2006.01)
*H03F 3/45* (2006.01)

(56) References Cited

U.S. PATENT DOCUMENTS

| | | | |
|---|---|---|---|
| 2013/0207731 A1* | 8/2013 | Balteanu | H03F 1/02 |
| | | | 330/296 |
| 2015/0054588 A1* | 2/2015 | Wimpenny | H03F 1/0227 |
| | | | 330/297 |
| 2016/0050629 A1* | 2/2016 | Khesbak | H04W 52/0261 |
| | | | 455/574 |
| 2016/0094192 A1* | 3/2016 | Khesbak | H04B 1/0475 |
| | | | 455/73 |
| 2016/0336901 A1* | 11/2016 | Khesbak | H04W 52/0261 |
| 2017/0005619 A1* | 1/2017 | Khlat | H03F 1/0227 |
| 2017/0006544 A1* | 1/2017 | Khlat | H03F 3/68 |

* cited by examiner

ENVELOPE TRACKING FOR HIGH POWER AMPLIFIERS

CROSS-REFERENCE TO RELATED APPLICATIONS

This application claims priority to U.S. Provisional Application Nos. 62/421,076 filed Nov. 11, 2017 and entitled "ENVELOPE TRACKING FOR HIGH POWER AMPLIFIERS," which is expressly incorporated by reference herein in its entirety for all purposes.

BACKGROUND

Field

The present disclosure generally relates to power supplies for power amplifier systems and more particularly to power supplies that employ envelope tracking to improve power amplifier performance.

Description of Related Art

Power amplifier systems are often powered using a supply voltage (e.g., from a battery). In some implementations, the voltage from the battery is regulated (e.g., with a buck converter or a boost converter) to a fixed value to compensate for variations in the voltage output from the battery due to manufacturing variation, age, temperature, discharge or other effects. Failure to employ such a regulator can result in a change in the compression characteristics of the power amplifier and degrade its linearity and the power delivered. However, use of a regulator increases the overall cost of the system. Furthermore, supplying just a fixed voltage to power amplifier systems can result in decreases in efficiency. To address such issues, power amplifier systems can employ envelope tracking to improve efficiency and linearity.

SUMMARY

According to a number of implementations, the present disclosure relates to a wireless communications system that includes an envelope tracking system including a plurality of fast error amplifiers, the envelope tracking system configured to generate a corresponding plurality of envelope tracking signals by combining individual outputs of individual fast error amplifiers with a regulated supply voltage from a DC-DC converter. The system also includes a plurality of power amplifiers connected in parallel between a signal input terminal and a signal output terminal, individual power amplifiers coupled to individual fast error amplifiers to receive a corresponding envelope tracking signal, the plurality of power amplifiers configured to amplify a portion of an input signal received at the input terminal so that a power load is divided among the plurality of power amplifiers. The system also includes a combiner configured to generate an output signal by combining amplified signals from the plurality of power amplifiers.

In some embodiments, the envelope tracking system includes an LC combiner to combine the regulated supply voltage with signals from the plurality of fast error amplifiers. In some embodiments, the plurality of power amplifiers includes one or more cascode amplifiers. In some embodiments, the system also includes an input impedance matching component disposed between the signal input terminal and the plurality of power amplifiers. In some embodiments, the system also includes an output impedance matching component disposed between the plurality of power amplifiers and the signal output terminal.

In some embodiments, the combiner is a class E combiner. In some embodiments, each fast error amplifier includes a class AB structure to generate the envelope tracking signal. In some embodiments, each fast error amplifier is configured to receive a unique regulated supply voltage. In further embodiments, the unique regulated supply voltages are provided by individual DC-DC converters.

In some embodiments, the combiner includes a harmonic trap to reduce harmonics in the output signal. In some embodiments, the combiner includes an impedance matching network. In some embodiments, the combiner is further configured to split the combined amplified signal for transmission on a plurality of antennas.

According to a number of implementations, the present disclosure relates to a radio-frequency (RF) module that includes a packaging substrate configured to receive a plurality of components. The RF module also includes a power amplifier system implemented on the packaging substrate, the power amplifier system including an envelope tracking system including a plurality of fast error amplifiers, the envelope tracking system configured to generate a corresponding plurality of envelope tracking signals by combining individual outputs of individual fast error amplifiers with a regulated supply voltage from a DC-DC converter, the power amplifier system also including a plurality of power amplifiers connected in parallel between a signal input terminal and a signal output terminal, individual power amplifiers coupled to individual fast error amplifiers to receive a corresponding envelope tracking signal, the plurality of power amplifiers configured to amplify a portion of an input signal received at the input terminal so that a power load is divided among the plurality of power amplifiers, and the power amplifier system also including a combiner configured to generate an output signal by combining amplified signals from the plurality of power amplifiers.

In some embodiments, the RF module also includes a plurality of DC-DC converters configured to generate corresponding regulated supply voltages to be combined with signals from individual fast error amplifiers to generate a plurality of different envelope tracking signals.

According to a number of implementations, the present disclosure relates to a wireless device that includes a transceiver configured to generate a radio-frequency (RF) signal. The wireless device also includes a front-end module (FEM) in communication with the transceiver, the FEM including a packaging substrate configured to receive a plurality of components, the FEM further including a power amplifier system implemented on the packaging substrate, the power amplifier system including an envelope tracking system including a plurality of fast error amplifiers, the envelope tracking system configured to generate a corresponding plurality of envelope tracking signals by combining individual outputs of individual fast error amplifiers with a regulated supply voltage from a DC-DC converter, a plurality of power amplifiers connected in parallel between a signal input terminal and a signal output terminal, individual power amplifiers coupled to individual fast error amplifiers to receive a corresponding envelope tracking signal, and a combiner configured to generate an amplified RF signal by combining amplified signals from the plurality of power amplifiers. The wireless device also includes an antenna in communication with the FEM, the antenna configured to transmit the amplified RF signal received from the power amplifier system.

In some embodiments, the amplified RF signal has a bandwidth of at least 40 MHz. In some embodiments, the amplified RF signal is delivered to the antenna with a power of at least 31 dBm. In some embodiments, the FEM is configured to perform uplink carrier aggregation.

In some embodiments, the combiner comprises a transformer-based combiner that couples amplified signals to respective output paths on an output portion of the combiner, the amplified signals combined to provide the amplified RF signal. In further embodiments, the power amplifier system is configured to provide intra-band carrier aggregation.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
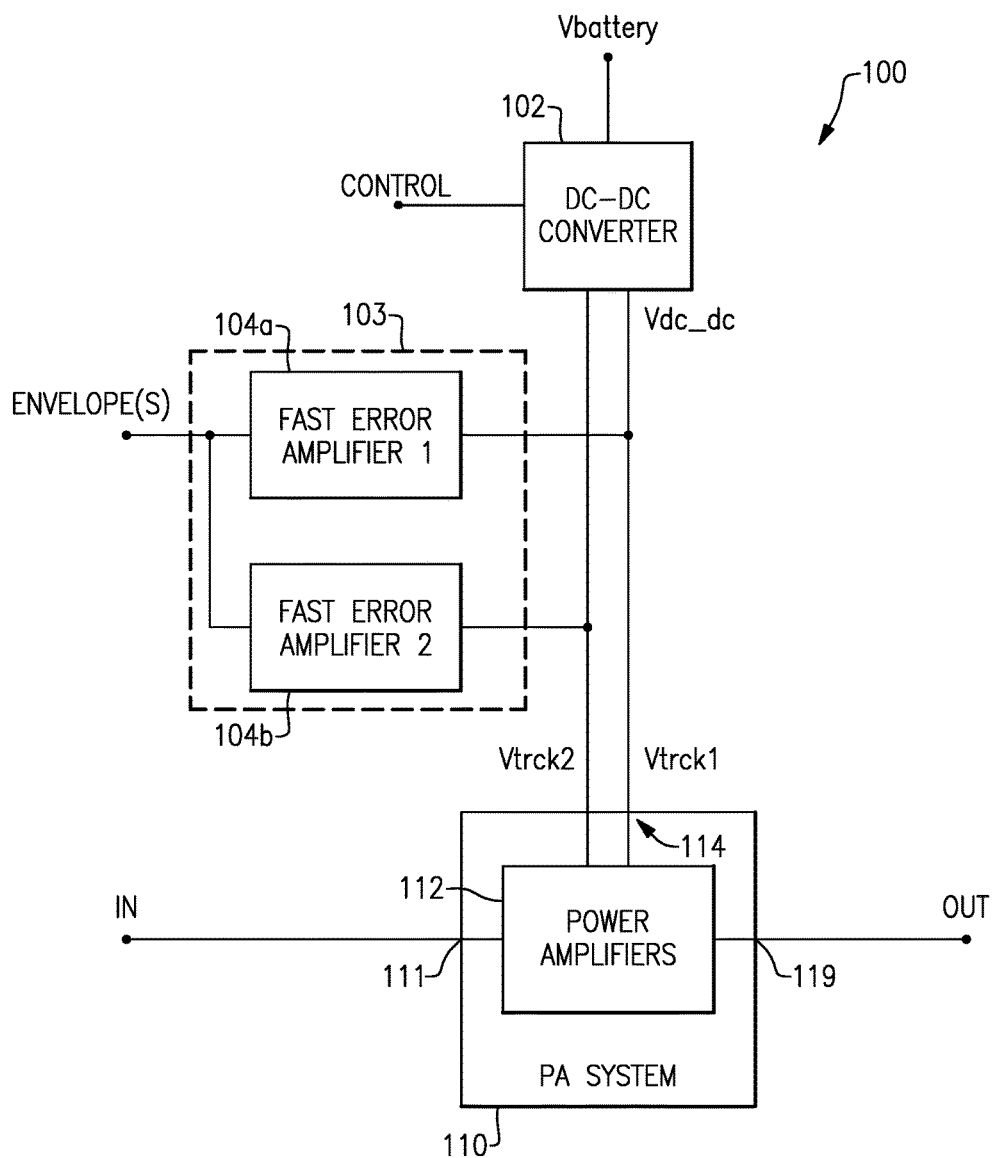
FIG. 1 illustrates an example wireless communication configuration that includes a power amplification (PA) system which may include several power amplifiers powered by a DC-DC converter and an envelope tracker.

The headings provided herein, if any, are for convenience only and do not necessarily affect the scope or meaning of the claimed invention.

Power amplifier systems are often powered using a supply voltage (e.g., from a battery). In some implementations, the voltage from the battery is regulated (e.g., with a buck converter or a boost converter) to a fixed value to compensate for variations in the voltage output from the battery due to manufacturing variation, age, temperature, discharge or other effects. Failure to employ such a regulator can result in a change in the compression characteristics of the power amplifier and degrade its linearity and the power delivered. However, use of a regulator increases the overall cost of the system. Furthermore, supplying just a fixed voltage to power amplifier systems can result in decreases in efficiency. To address such issues, power amplifier systems can employ envelope tracking to improve efficiency and linearity.

Envelope tracking is widely used in wireless devices, such as smartphones and other mobile devices, to increase the power amplifier (PA) efficiency and linearity. Certain protocols and wireless standards use relatively high bandwidths and improvements to typical envelope tracking systems would be advantageous. For example, LTE-Advanced uses higher modulation bandwidth (e.g., about 40 MHz) than previous standards (e.g., less than or equal to about 20 MHz). In addition, uplink carrier aggregation of two or more cellular bands results in the need for increased power to be delivered by the PA. A typical front end module designed to handle these protocols (e.g., LTE-Advanced) generally includes filters and switches that may not have been previously used or necessary. This increase in components can result in additional losses in the transmission path. Accordingly, there is a need to increase the power delivered to the antenna port to accommodate these additional losses and increases in power requirements for updated communication standards.

Disclosed herein are various examples of circuits, devices and methods that can be configured to, among other things, address the foregoing challenges associated with power amplifier systems. In some implementations, a power amplifier system includes two or more fast error amplifiers coupled to corresponding power amplifiers. The fast error amplifiers are configured to generate envelope tracking signals based on a signal envelope, the envelope tracking signals modifying a DC-DC regulated voltage from a DC-DC converter to more efficiently operate the power amplifiers. By splitting the envelope tracking between two or more fast error amplifiers and amplification between corresponding two or more power amplifiers, the power, frequency or bandwidth, linearity, signal-to-noise ratio, efficiency, or the like of the power amplifier system can be improved. Wireless communications configurations with such power amplifier systems can provide uplink carrier aggregation and/or cellular signals based on standards and protocols that require increased bandwidth (e.g., at least about 40 MHz) and/or power (e.g., at least about 31 dBm), such as LTE-Advanced. Another advantageous feature of the disclosed embodiments is that each PA in the power amplification system can have a higher load line than a power amplification system that uses a single PA path to amplify a signal. By way of example, some embodiments of the disclosed power amplification systems divide the power load of the amplification process between 2 PAs so that each PA can perform better than a single PA with double the power load at the same voltage. This can be extended to more than two PAs in a power amplification system, as disclosed herein.

As an example of increased power requirements, LTE power delivered at an antenna as required by the 3GPP standard is 23 dBm. Assuming a 5 dB-loss due to filters, duplexers, switches, diplexers, board losses, and the like, the PA should be configured to deliver at least about 28 dBm at a bandwidth of about 20 MHz. For LTE-Advanced, the modulation uplink bandwidth is increased from 20 MHz to 40 MHz. To achieve the same or similar signal to noise ratio (SNR) with the higher modulation bandwidth (assuming the same propagation environment), the output power of the PA should be increased based on the following equation:

$$Pout_{B2} = Pout_{B1} + 10\log\left(\frac{B_2}{B_1}\right) \quad (1)$$

where $B_1$ and $B_2$ represent the respective modulation bandwidths.

Based on equation (1), there is an increase to about 31 dBm for the output power delivered by the PA for an increase from 20 MHz to 40 MHz. Assuming the load line, Rload, the maximum power delivered by the PA for different voltage supplies, Vdd, is based on the following equation:

$$Pout = \frac{(Vdd - Vkn)^2}{2Rload} \quad (2)$$

where $V_{kn}$ is the knee voltage. For a linear PA operating under envelope tracking, the instantaneous supply voltage $V_{dd}$ is provided by the tracker. Based on equation (2), increasing the power delivered by the PA to about 31 dBm requires an increase of the voltage supply and/or a decrease of the load line. For 40 MHz LTE-Advanced, for example, there is also an increase to the peak to average power average ratio (PAPR) to about 8.3 dB. This increase may require higher peak voltages delivered by the tracker as indicated by the following equation:

$$PAPR_{db} = 20\log\left(\frac{Vdd\_pk}{Vdc\_dc}\right) \quad (3)$$

Accordingly, described herein are systems, devices, and methods configured to provide increased power, linearity, and/or efficiency to address increases in requirements for power and/or bandwidth. Embodiments described herein can include an envelope tracker that combines a DC voltage provided by a DC-DC converter and a high frequency component provided by two or more fast error amplifiers. Each fast error amplifier can be DC- or AC-connected at the output. In some implementations, an AC-connected system may use a DC tracking loop to provide energy at low frequencies for low modulation bandwidth. In such implementations, the AC-connected system may have better efficiency than a DC-connected system for higher modulation bandwidth (e.g., LTE-A 40 MHz). The fast error amplifiers can employ techniques described herein to increase the slew rate of the amplifier to improve performance. To increase the maximum frequency to targeted levels, as well as to increase the output power of the PA, the amplifier can be split into two or more sections having similar or identical components, being joined by a combiner. This structure increases the load, Rload, seen by each fast error amplifier and therefore increases the frequency of operation. In some implementations, splitting the fast error amplifier into two sections doubles the load, Rload, and doubles the frequency of operation.

FIG. 1 illustrates an example wireless communication configuration 100 that includes a power amplification (PA) system 110 that can include a plurality of power amplifiers powered by a DC-DC converter 102 and an envelope tracker 103. The envelope tracker includes a plurality of fast error amplifiers 104a, 104b configured to provide tracking signals to be combined with a DC voltage from the DC-DC converter 102 to provide a plurality of tracking voltages to the PA system 110. The fast error amplifiers 104a, 104b together can make it so that the power amplifiers 112 operate at a desired or targeted bandwidth and with a targeted power output. Using a plurality of error amplifiers 104a, 104b increases the load seen by each error amplifier 104a, 104b thereby increasing the frequency of operation, as described in greater detail herein.

The PA system 110 is configured to amplify a signal, such as a radio-frequency signal. The PA system 110 includes a signal input 111 and a signal output 119 with a plurality of power amplifiers 112 coupled between the signal input 111 and the signal output 119. The power amplifiers 112 are configured to amplify a signal received at the signal input 111 and to output the amplified signal at the signal output 119. The power amplifiers 112 are configured to receive a supply voltage that is a combination of a regulated battery voltage from the DC-DC converter 102 and an envelope tracking signal. The PA system 110 may include a controller configured to control the power amplifiers 112 based at least in part on the battery voltage, supply voltage, or a power output of the power amplifiers 112. The power amplifiers 112 can include a plurality of amplifiers arranged in parallel, arranged in series, arranged to have multiple amplification stages, or any combination of these. The input port 111 of the PA system 110 can be coupled to a transceiver through one or more electrical components to receive signals to be amplified. The output port 119 of the PA system 110 can be coupled to an antenna or an antenna port through one or more electrical components.

The power amplifiers 112 are powered by tracking voltages (Vtrck1, Vtrck2) via a supply terminal 114. The tracking voltages are a combination of a voltage from a DC-DC converter 102 (Vdc_dc) and voltages from fast error amplifiers 104a, 104b. The DC-DC converter 102 receives a voltage (Vbattery) from a power supply, such as a battery, and can be a buck converter, a boost converter, or a buck-boost converter. The supply voltage is combined with envelope tracking signals to power the power amplifiers 112. The envelope tracker 103 can receive a signal indicative of the envelope of the signal to be amplified and can produce a corresponding envelope tracking signal. Similarly, the envelope tracker 103 can receive a plurality of signals indicative of the envelopes of the signals to be amplified and can produce corresponding envelope tracking signals. The supply voltage and the envelope tracking signal are combined and provided at the supply terminal 114 of the PA system.

The PA system 110 may include a controller configured to selectively provide an enable signal to one or more of the plurality of power amplifiers 112. In some implementations, the controller is further configured to provide an enable signal based on the supply voltage. In some implementations, the controller is powered by the supply voltage and can, thereby, determine the supply voltage and any variations thereof.

Figure 2:
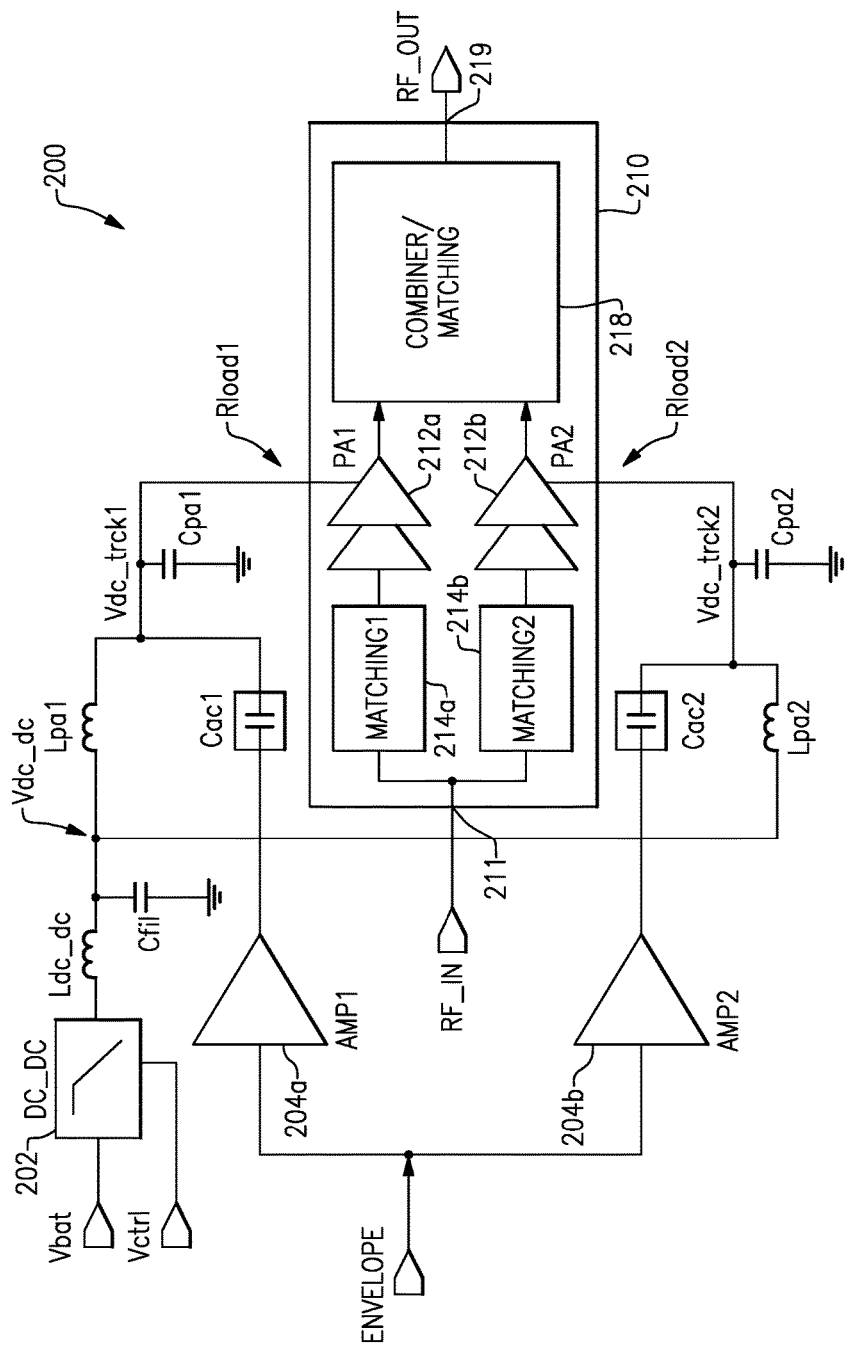
FIG. 2 illustrates an example wireless communication configuration that includes an example implementation of an envelope tracker with two fast error amplifiers and a radio frequency ("RF") combiner.

FIG. 2 illustrates an example wireless communication configuration 200 that includes an example implementation of an envelope tracker with two fast error amplifiers 204a, 204b and a radio frequency (RF) combiner 218. The envelope tracker receives a signal indicative of the envelope of the signal to be amplified (e.g., the signal at "RF_in") and produces an envelope tracking signal from individual fast error amplifiers 204a, 204b. The wireless communication configuration 200 also includes a DC-DC converter 202 that receives a battery voltage (or a voltage from any suitable power supply, labeled "Vbat") and a control signal "Vctrl," and generates a regulated supply voltage "Vdc_dc." The DC-DC voltage passes through a DC-DC inductor, Ldc_dc, with a capacitor, Cfil, coupled to a reference potential (e.g., ground). This generates the Vdc_dc that is coupled to the signal from the fast error amplifiers 204a, 204b through an LC combiner that includes an inductor (Lpa1 or Lpa2) between the DC-DC converter 202 and an LC node and a capacitor (Cac1 or Cac2) between respective fast error amplifiers 204a, 204b and the LC node. The LC combiner operates to combine the constant component of the supply voltage and the variable component of the envelope tracking signal from the respective fast error amplifiers 204a, 204b. From the respective LC nodes a tracking signal is provided, Vdc_trck1 or Vdc_trck2, with capacitors (Cpa1 or Cpa2) coupled in parallel to a reference potential. These tracking signals are directed to respective power amplifiers 212a, 212b in a power amplifier system 210.

The power amplifier system 210 includes a signal input port 211 to receive a signal, such as a radio frequency (RF) signal, to be amplified. The power amplifier system 210 includes input matching networks 214a, 214b to match input impedances to the power amplifiers 212a, 212b. The power amplifiers 212a, 212b are illustrated as multi-stage amplifiers but can be any suitable configuration of amplifier including, but not limited to, Doherty amplifiers, cascode amplifiers, single stage amplifiers, multi-stage amplifiers, and the like. The amplified signals from the power amplifiers 212a, 212b are combined in a combiner/matching component 218 (or RF combiner) and output at a signal output port 219. The combiner/matching component 218 is configured to provide impedance matching networks to match the output impedance to the power amplifiers 212a, 212b.

The tracking signals, Vdc_trck1 and Vdc_trck2, are provided to the power amplifiers 212a, 212b with tailored loads, Rload1 and Rload2, respectively. As described herein, the load lines for the power amplifiers can be tailored to provide a targeted or desired output (e.g., see Equation 2). The disclosed system allows each power amplifier 212a, 212b to have a higher load line to achieve a targeted output power than a power amplification system using a single amplifier. Accordingly, the disclosed wireless communication configuration 200 divides the power load between the power amplifiers 212a, 212b so that each power amplifier provides superior performance relative to a single power amplifier with double the power load at the same supply voltage.

Advantageously, by combining signals from different power amplifiers 212a, 212b to provide a single output signal, the signal to noise ratio may be improved. Due at least in part to noise incoherence between amplification paths, the random fluctuations in the signal arising due to noise may, on average, cancel out to reduce noise in the amplified signal.

Figure 3:
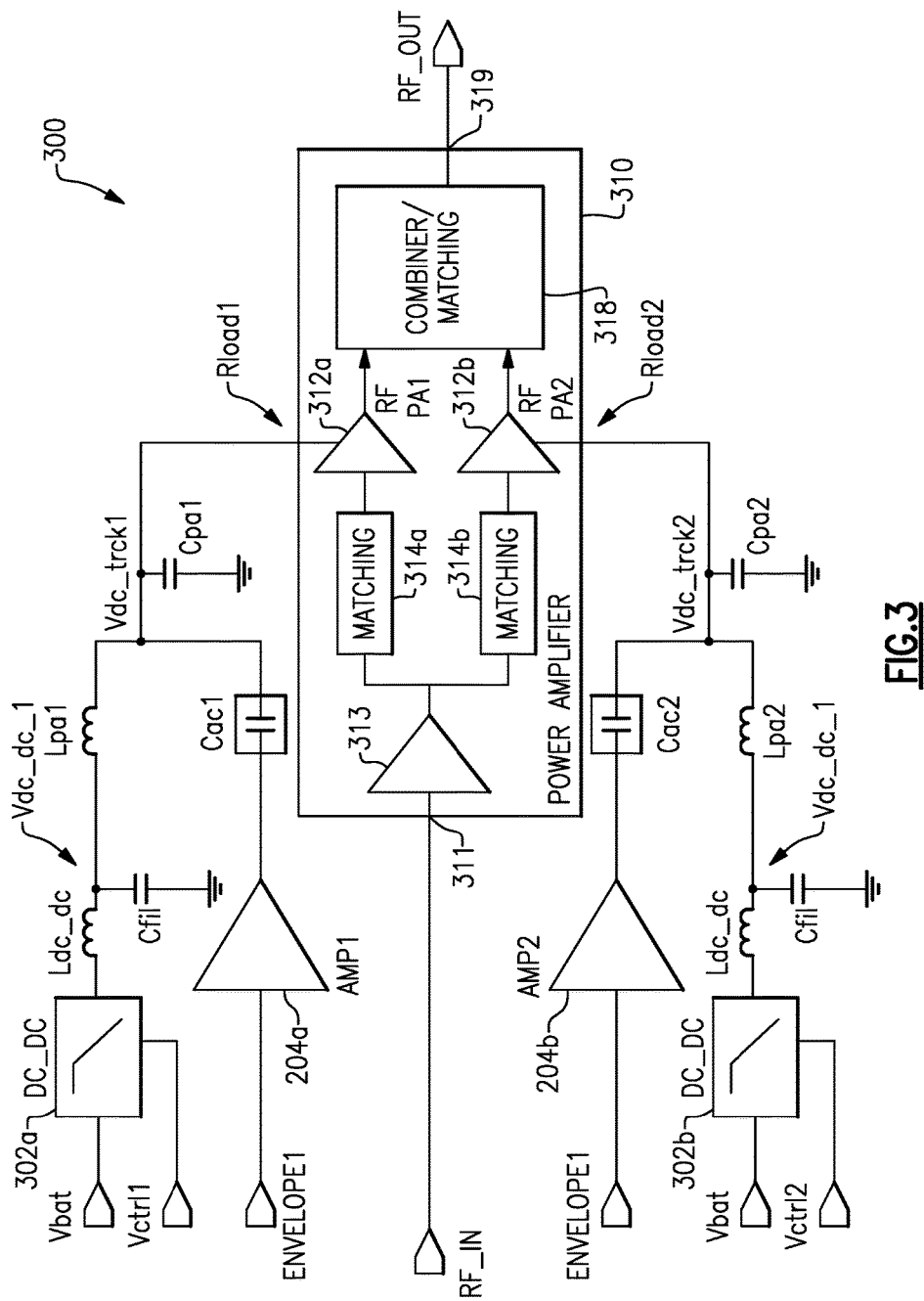
FIG. 3 illustrates another example wireless communication configuration with two DC-DC converters that receive the same supply voltage but different envelope control signals and a RF combiner.

FIG. 3 illustrates another example wireless communication configuration 300 similar to the configuration 200 described herein with reference to FIG. 2. In the configuration 300, there are two DC-DC converters that each receive a supply voltage, Vbat, but different envelope control signals, Vctrl1 and Vctrl2. This can result in two different tracking signals, Vdc_trck1 and Vdc_trck2, after combining the DC-DC voltage with the envelope tracking signal provided by fast error amplifiers 204a, 204b. The different tracking signals can be used to operate the power amplifiers 312a, 312b differently to obtain different signal characteristics and/or to improve signal quality.

The power amplifier system 310 includes a first amplifier 313 which provides an initial amplification stage that is split and directed into respective matching networks 314a, 314b and then second amplifiers 312a, 312b for a final amplification stage. The second amplifiers 312a, 312b receive the different tracking signals as described herein. The amplified signals from the second amplifiers 312a, 312b are combined in a combining/matching component 318 (or RF combiner), examples of which are described in greater detail herein. Advantageously, each amplifier 312a, 312b can be operated at lower power thereby achieving higher linearity than a configuration with a single power amplifier path.

Figure 4:
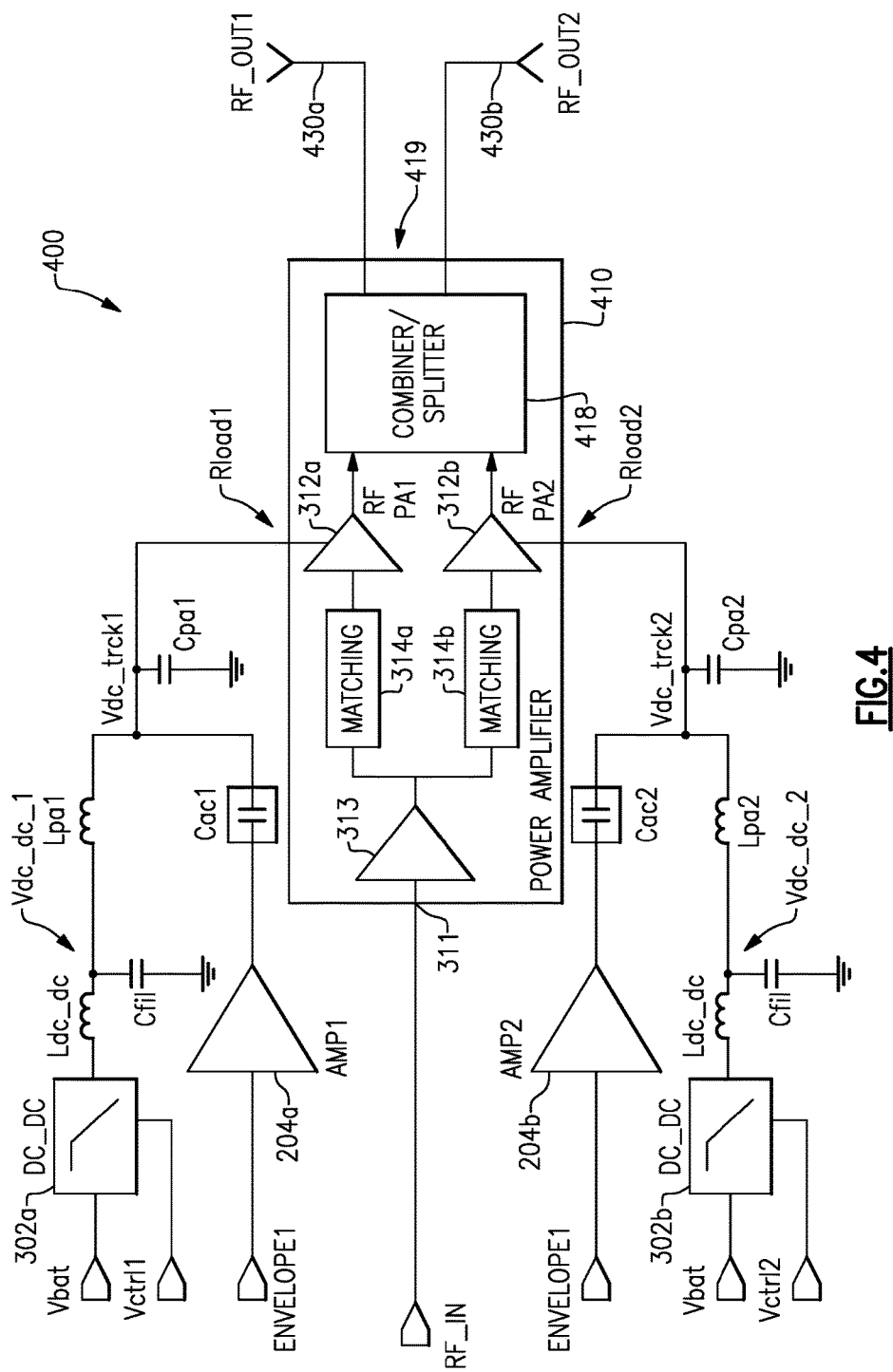
FIG. 4 illustrates another example wireless communication configuration wherein signals from a power amplifier system are directed to multiple output antennas.

FIG. 4 illustrates another example wireless communication configuration 400 similar to the configuration 300 described herein with reference to FIG. 3, except that the signals from the power amplifier system 410 are directed to multiple output antennas 430a, 430b. This configuration 400 may be particularly advantageous in multiple input multiple output (MIMO) configurations. The power amplifier system 410 includes a combiner/splitter 418 that is configured to receive signals from respective power amplifiers 312a, 312b, to combine the signals, and to send copies of the combined signals to the multiple antennas 430a, 430b. It is to be understood that two or more antennas may be used in the configuration 400.

Figure 5:
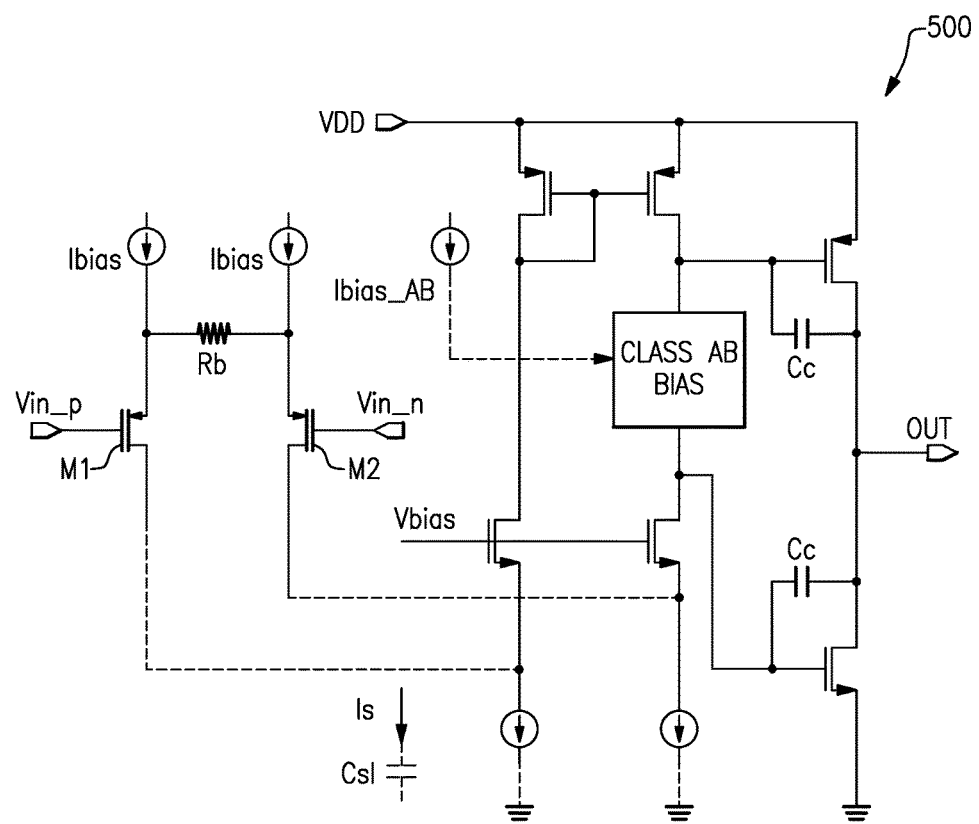
FIG. 5 illustrates an example of a fast error amplifier that can be implemented to provide a targeted envelope signal for a power amplifier.

FIG. 5 illustrates an example of a fast error amplifier 504 that can be implemented with any of the power amplifier systems described herein to provide the targeted envelope signal for a power amplifier. As described herein, the fast error amplifier 504 can be implemented in envelope tracking systems that include at least two fast error amplifiers to provide a targeted frequency performance for particular cellular standards (e.g., LTE-Advanced).

The fast error amplifier 504 uses a Class AB structure with a degenerated input stage to increase the slew rate (SR) of the amplifier 504. The overall slew rate of the amplifier 504 depends at least in part on the minimum of the input slew rate and the output slew rate. The input slew rate is given by the equation:

$$SR_{in} = \frac{2I_{bias}}{C_{sl}} \qquad (4)$$

where $I_{bias}$ is the bias current provided to the source terminals of the transistors M1, M2 that are biased using received input signals Vin_p, Vin_n, and $C_{sl}$ is a capacitor that couples the source current to a reference potential (e.g., ground). To increase the SR, $I_{bias}$ may be increased.

In some implementations, using an AC-coupled error amplifier that operates at lower voltage supply than a DC-coupled error amplifier reduces the energy dissipated in the error amplifier due to bias circuitry. The output SR is determined by the output voltage swing over time and depends at least in part on $C_{pa}$ and Rload. For a high-power power amplifier, Rload can be low (e.g., see Equation 2) and may be a dominating factor for the slew rate of the fast error amplifier 504. The maximum frequency for which the error amplifier 504 has an undistorted signal is given by:

$$F_{max} = \frac{SR}{2\pi V_{outpk}} \quad (5)$$

where $V_{outpk}$ is the peak output voltage from the power amplifier.

Based at least in part on Equation 5, to increase the maximum frequency to a targeted frequency (e.g., from about 20 MHz to about 40 MHz) and to increase the output power of the power amplifier system, a wireless communications configuration (e.g., configurations 200, 300, and/or 400) can be split into two or more identical sections having two class AB error amplifiers, two identical PAs, and a Class E power amplifier output match combiner, examples of which are illustrated in FIGS. 2-4. Such configurations can double the load, Rload, seen by each fast error amplifier thereby doubling the frequency of operation. In some embodiments, the power amplifiers may be integrated using Gallium Arsenide (GaAs) technology with the output match and combiner using a Class E structure. In some embodiments, the fast error amplifier 504 includes a second harmonic trap.

Figure 6:
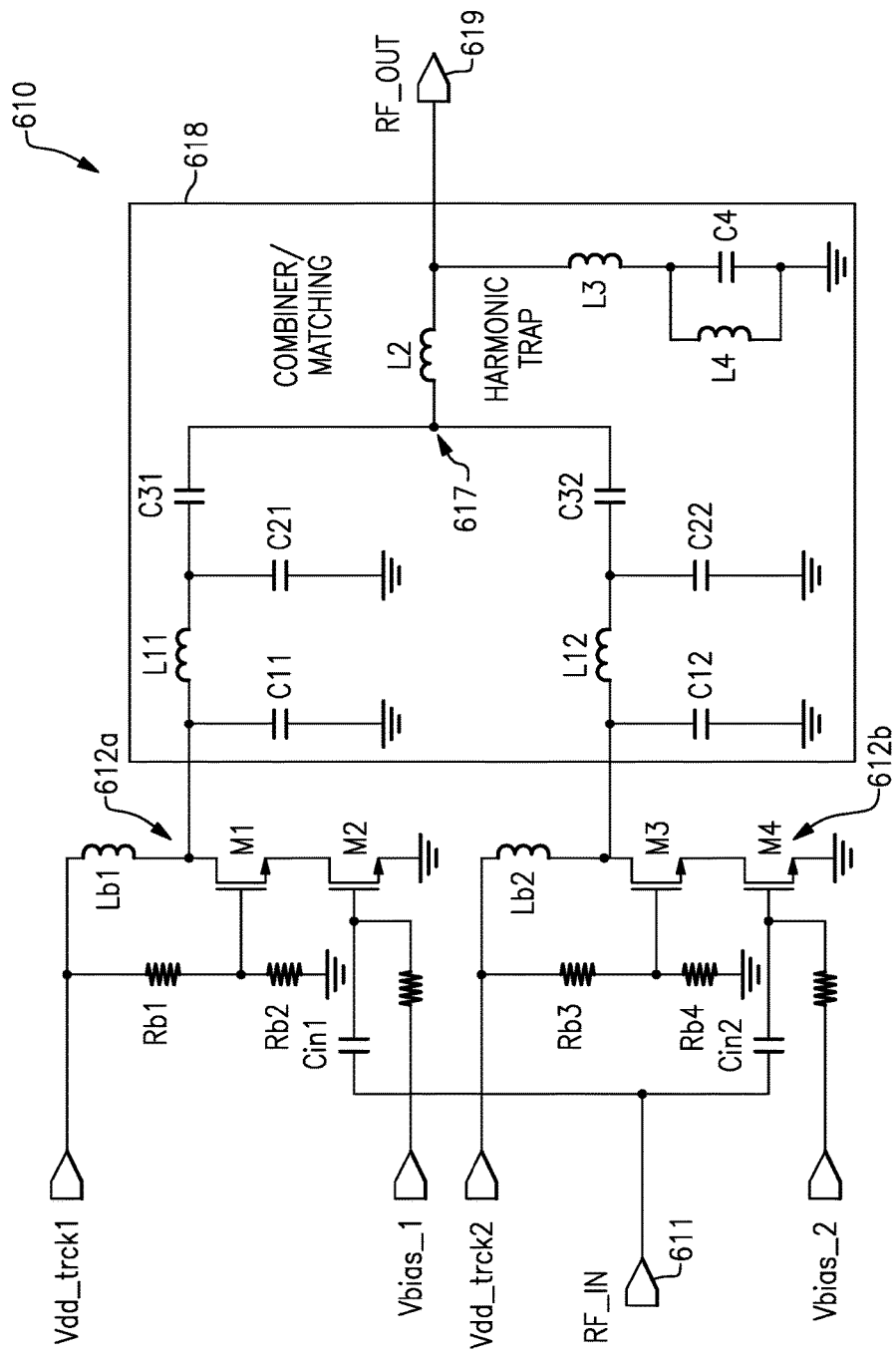
FIG. 6 illustrates an example of a power amplifier system that can be integrated with a fast error amplifiers wherein a tracking signal generated by an envelope tracker can be used to dynamically bias cascode transistors of the power amplifier core to improve linearity.

FIG. 6 illustrates an example of a power amplifier system 610 that can be integrated with any of the fast error amplifiers described herein. In some embodiments, the power amplifier system 610 can comprise a complementary metal-oxide-semiconductor (CMOS) power amplifier. In such implementations, the Vdd_trck generated by the envelope tracker can be used to dynamically bias cascode transistors of a power amplifier core (e.g., cascode transistors M1 and M2 and cascode transistors M3 and M4) to further improve the linearity for a linear power amplifier.

The combiner/matching component 618 is configured to receive amplified signals from respective amplification branches and to combine the signals at the output 619 of the power amplifier system 610. The combiner/matching component 618 includes LC combiner configurations with inductors L11, L12 and capacitors C31, C32 in series with additional capacitors C11, C21, C12, C22 in parallel to respective reference potential nodes. The signals are combined at junction node 617, and are then passed through inductor L2 with a harmonic trap coupled after the inductor L2, the harmonic trap configured to provide a parallel path to a reference potential node through an inductor L3 in series with a parallel configuration of inductor L4 and capacitor C4. The combiner/matching component 618 can be an example of a Class E combiner/matching circuit (e.g., an RF combiner).

In the power amplifier system 610, each of the power amplifiers 612a, 612b is a cascode power amplifier including two transistors, a drain of the first transistor coupled to a source of a second transistor. The first power amplifier 612a includes cascode transistors M1 and M2 and the second power amplifier 612b includes cascode transistors M3 and M4. Each of the power amplifiers 612a, 612b is powered by a component of the tracking signal (Vdd_trck1, Vdd_trck2 coupled to the respective source terminals through inductors Lb1, Lb2). The transistors in a common-emitter configuration in each cascode power amplifier (e.g., transistors M2 and M4) are biased by a combination of the input signal RF_in and respective dedicated bias signals Vbias_1, Vbias_2. The dedicated bias signals Vbias_1, Vbias_2 can be configured to bias respective transistors in advantageous, targeted, or optimum operating regions. The transistors M1, M3 respectively coupled to the common-source transistors M2, M4 are biased by scaled versions of the tracking signals Vdd_trck1, Vdd_trck2. In some embodiments, the power amplifiers 612a, 612b are CMOS power amplifiers.

The envelope signal dynamically biases the top cascode transistors M1 and M3 and keeps the main RF gain transistors in a constant gm region. The relation between the drain current, $I_D$, and voltage, $V_{DS}$, is given by the equation:

$$I_D = \frac{1}{2}\mu C_{ox}\frac{W}{L}(V_{GS} - V_{TH})^2(1 + \lambda V_{DS}) \quad (6)$$

Due at least in part to voltage tracking for the RF gain devices, these power amplifiers are configured to operate in a linear region for high RF power variation, which is the case for a high PAPR signal. This same technique can advantageously be applied to silicon germanium (SiGe) and GaAs cascode power amplifiers in addition to CMOS power amplifiers.

Figure 7:
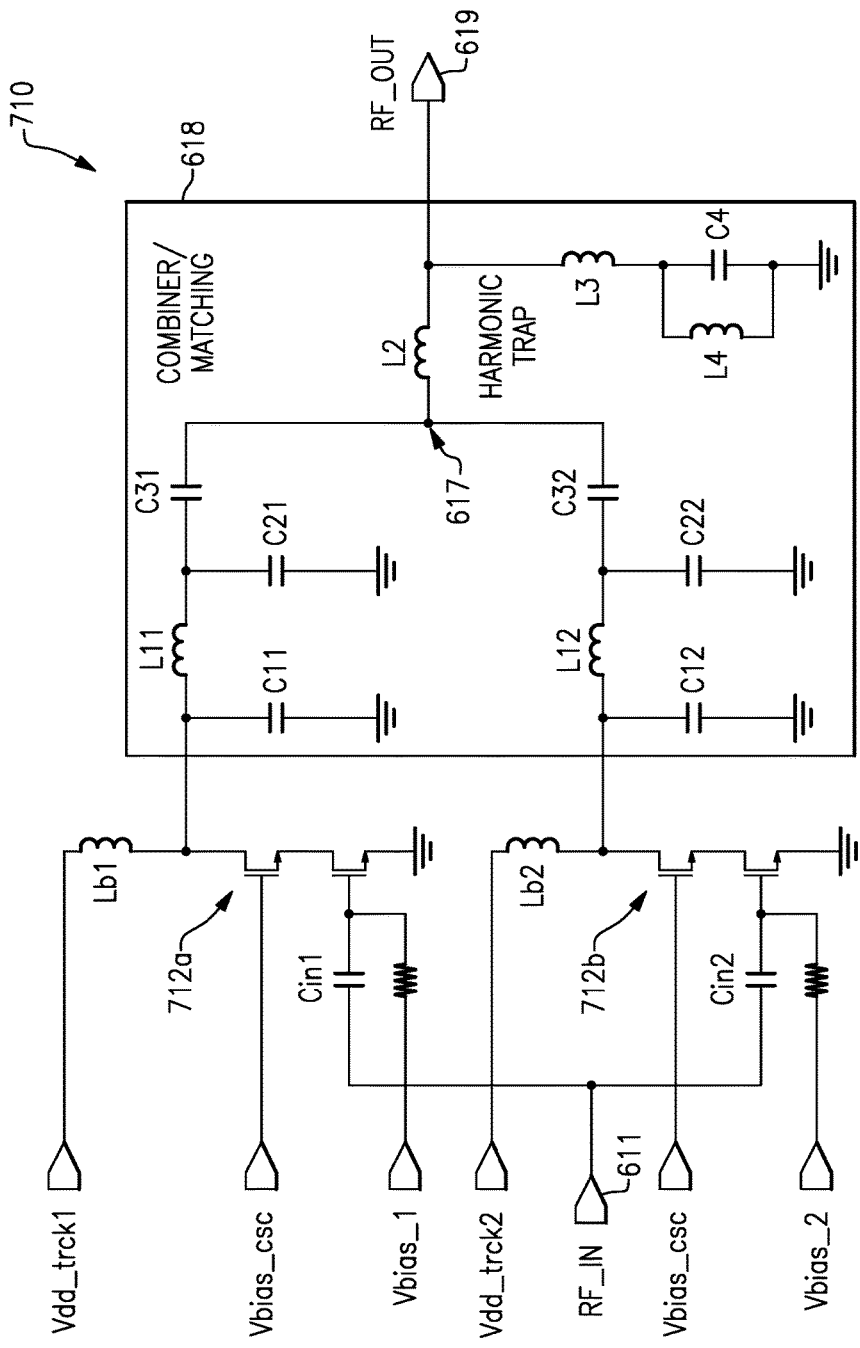
FIG. 7 illustrates another example of a power amplifier system that includes cascode amplifiers wherein the top cascode transistors are biased by a bias signal rather than a scaled version of the tracking signals.

FIG. 7 illustrates another example of a power amplifier system 710 similar to the power amplifier system 610 described herein with reference to FIG. 6. In the power amplifier system 710, the amplifiers 712a, 712b are cascode amplifiers, but the top cascode transistors are biased by a bias signal Vbias_csc rather than a scaled version of the tracking signals Vdd_trck1, Vdd_trck2. In some embodiments, the power amplifiers 712a, 712b are CMOS power amplifiers. However, this same configuration can advantageously utilize SiGe and GaAs cascode power amplifiers in addition to CMOS power amplifiers.

Figure 8:
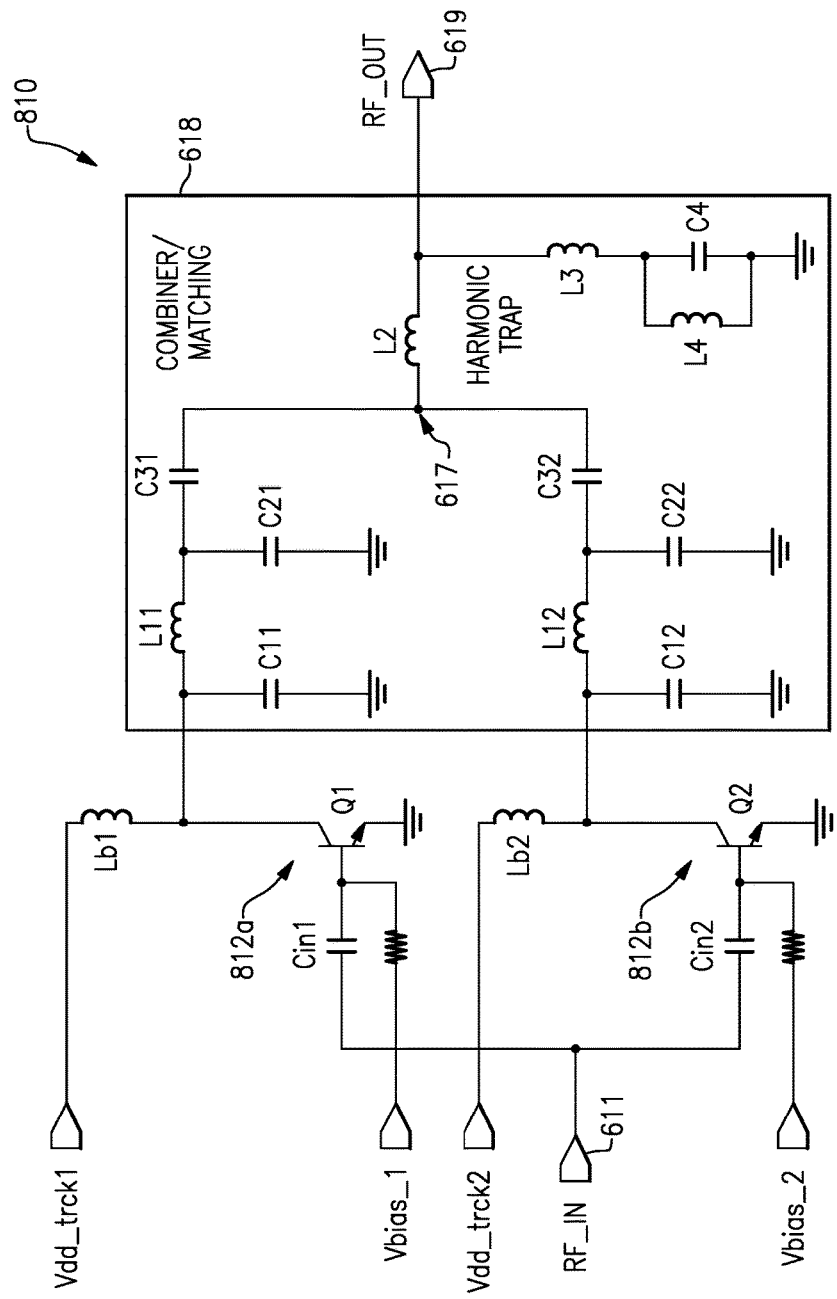
FIG. 8 illustrates another example of a power amplifier system wherein the amplifiers each include a single transistor rather than the cascode configuration.

FIG. 8 illustrates another example of a power amplifier system 810 similar to the power amplifier system 610 described herein with reference to FIG. 6. In the power amplifier system 810, the amplifiers 812a, 812b each include a single transistor Q1, Q2 rather than the cascode configuration of the systems 610, 710. The power amplification system 810 can be advantageously utilized for GaAs power amplifiers. However, this same configuration can advantageously utilize SiGe and CMOS power amplifiers in addition to GaAs power amplifiers.

Figure 9:
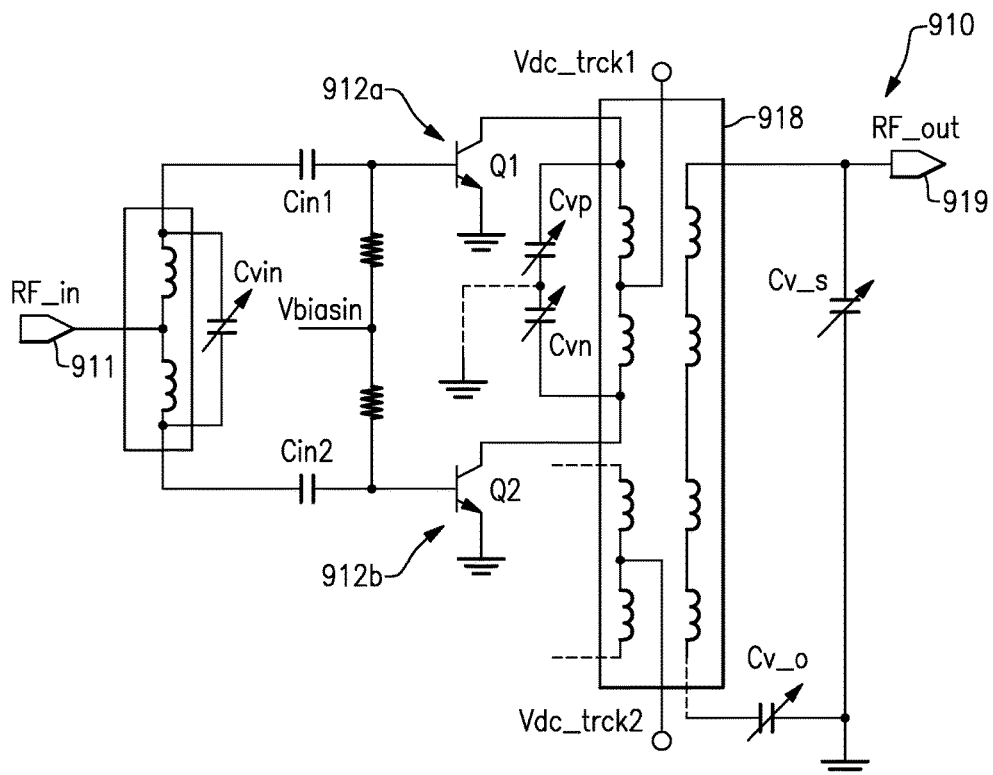
FIG. 9 illustrates an example power amplifier system with a transformer-based combiner.

FIG. 9 illustrates an example power amplifier system 910 with a transformer-based combiner 918. The power amplifier system 910 includes power amplifiers 912a, 912b that are biased based on a combination of the input signal RF_in received at input port 911 and the voltage Vbiasin. The voltage bias Vbiasin can be configured to bias the amplifier structure in an advantageous, targeted, or optimal operating region. The power amplifiers 912a, 912b are respectively powered by tracking signals Vdc_trck1, Vdc_trck2, generated as described herein. Each power amplifier 912a, 912b includes variable capacitors Cvp, Cvn coupled to a signal path providing the tracking signals through one or more inductors. The inductors serve to couple amplified signals to respective paths on an output portion of the combiner 918, the amplified signals being combined to provide a combined output at output port 919. The output path includes variable capacitors Cv_s, Cv_o providing paths to a reference potential (e.g., ground). In some embodiments, the power amplifiers are integrated using GaAs technology with the output match and combiner 918 using a Class E structure. The power amplifier system 910 can be extended for use with 2 or more power amplifiers for higher power and intra-band carrier aggregation (CA).

Figure 10:
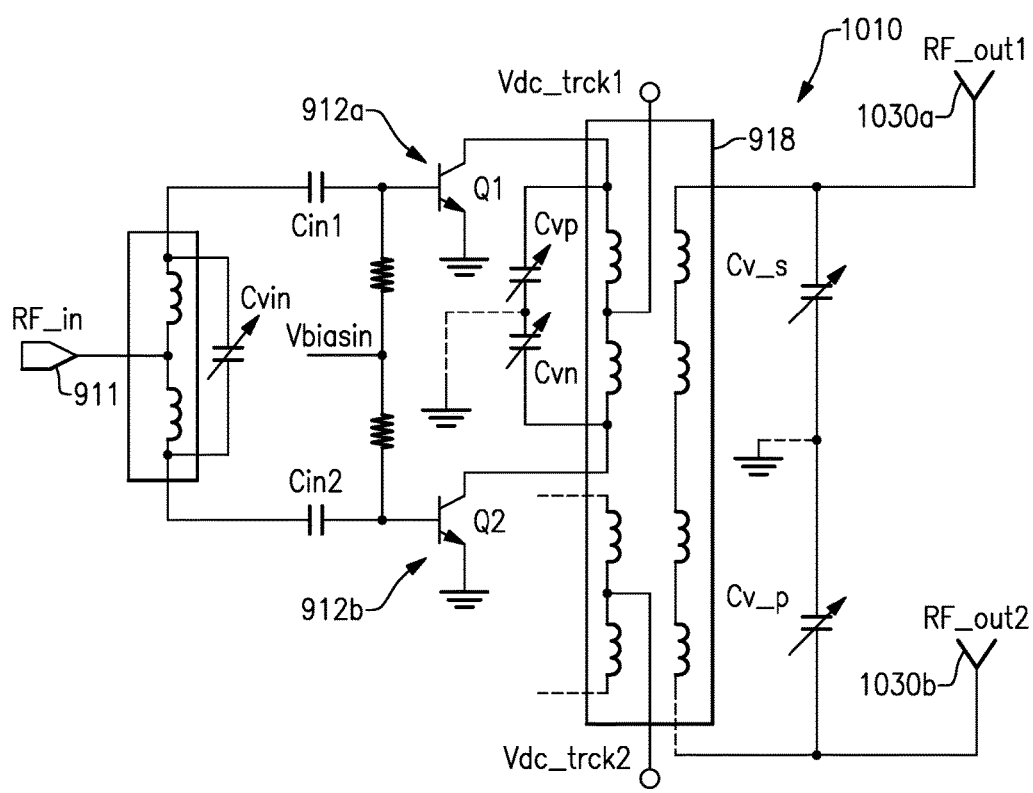
FIG. 10 illustrates another example power amplifier system with a transformer-based combiner for use with MIMO wireless communications configurations.

FIG. 10 illustrates another example power amplifier system 1010 with a transformer-based combiner 1018 for use with MIMO wireless communications configurations. The power amplifier system 1010 is similar to the power amplifier system 910 described herein with reference to FIG. 9, but the output can be split and/or duplicated and sent to two (or more) antennas 1030*a*, 1030*b* for MIMO applications.

Figure 11A:
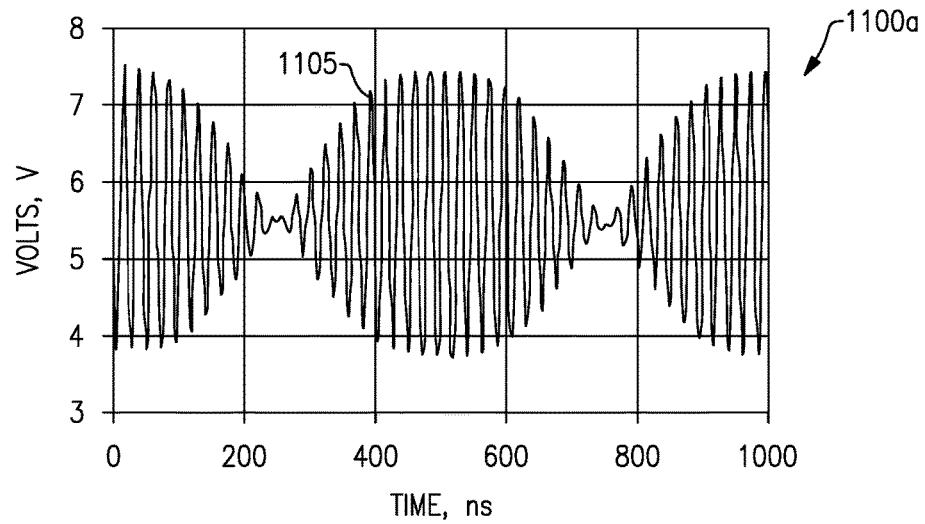
FIGS. 11A and 11B illustrate simulated results of using a power amplifier system that splits the tracking signal to two fast error amplifiers.
Figure 11B:
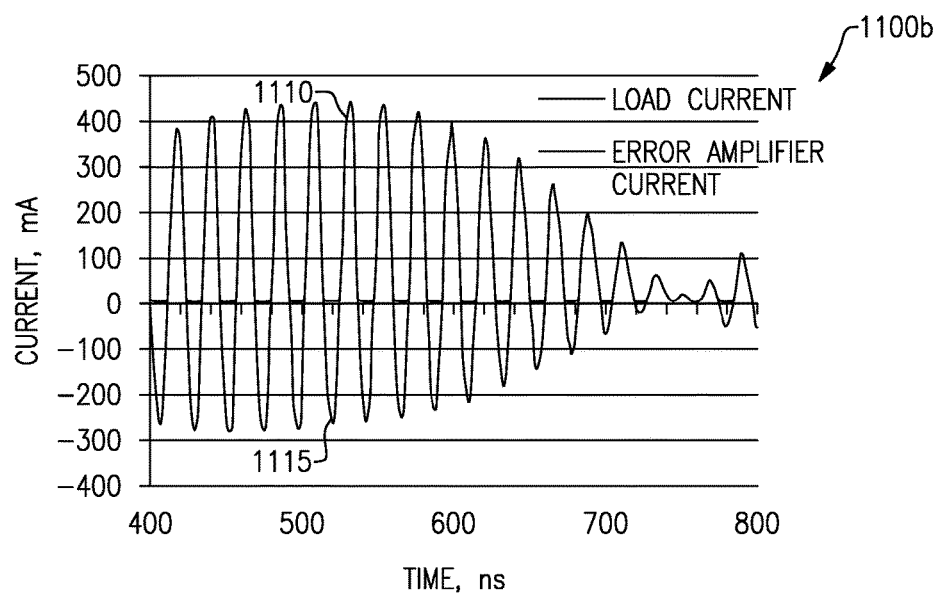

FIGS. 11A and 11B illustrate simulated results of using a power amplifier system that splits the tracking signal to two fast error amplifiers, as described herein. The envelope tracking circuitry was simulated using 0.18 μm CMOS technology. The Rload for each power amplifier was set to 5.5Ω. For two envelope tones set at 43 MHz and 45 MHz, as shown by the line 1105 in plot 1100*a*, the peaks reach about 7.5 V. Plot 1100*b* shows the error amplifier current, line 1110, and the load current, line 1115, as a function of time. Based on Equation 2 and assuming Vkn is about 0.4 V, the peak power, Ppeak, for one amplifier that can be delivered under envelope tracking operation is about 36.6 dBm. Assuming a PAPR of 8.3 dB for a 40 MHz LTE signal without any de-cresting and 0.3 dB loss in the matching/combiner network, the linear power, $Pout_{lin}$, that can be delivered by one amplifier is given by the equation:

$$Pout_{lin} = Ppeak - 8.3 \text{ dB} - 0.3 \text{ dB} = 28 \text{ dBm} \quad (7)$$

The simulation of two parallel systems combined together shows that the linear power, Pout, that can be delivered is given by the equation:

$$Pout = Pout_{lin} + 3 \text{ dB} = 31 \text{ dBm} \quad (8)$$

Figure 12:
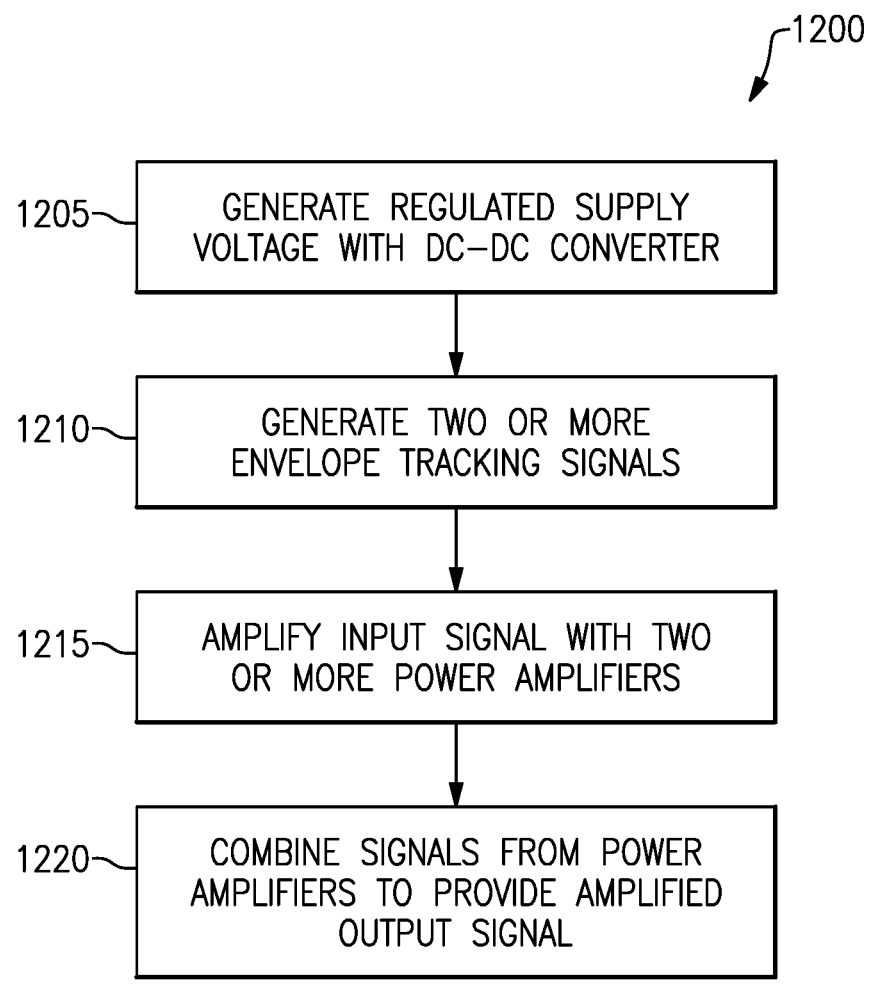
FIG. 12 illustrates a flow chart of an example method of generating an envelope tracking signal using two or more fast error amplifiers to power one or more power amplifiers.

FIG. 12 illustrates a flow chart of an example method 1200 of generating an envelope tracking signal using two or more fast error amplifiers to power one or more power amplifiers. For ease of description, the method 1200 is described as being performed by a wireless communications configuration, examples of which are described herein with respect to FIGS. 1-10. However, it is to be understood that the method 1200 can be performed, wholly or partially, by any component or groups of components described herein. Similarly, any step or partial step of the method 1200 can be performed by a single component or combination of components of a wireless communications configuration.

In block 1205, a wireless communications configuration generates a regulated supply voltage using a DC-DC converter. The DC-DC converter can be a buck converter, a boost converter, a buck-boost converter, a charge pump, or any other suitable component configured to generate a regulated voltage using a voltage from a battery or other power supply.

In block 1210, the wireless communications configuration generates two or more envelope tracking signals by combining the regulated supply voltage to signals generated by two or more fast error amplifiers of an envelope tracker. Individual fast error amplifiers are configured to receive a signal indicative of a signal envelope and to generate an output signal to be combined with the regulated supply voltage from the DC-DC converter. By splitting the envelope tracking operation among two or more fast error amplifiers, the frequency or bandwidth of the system can be increased.

In block 1215, the wireless communications configuration amplifies an input signal using two or more power amplifiers powered respectively by the two or more fast error amplifiers that generated the envelope tracking signals. The input signal can be split to two or more amplification paths with power amplifiers on each amplification path. The wireless communications configuration can include one or more input impedance matching networks prior to amplification or as part of the two or more amplification paths. By using two or more power amplifiers to amplify the signal, each power amplifier can have a higher load line relative to a power amplification method that utilizes a single power amplifier path. This further allows the power load to be divided among the plurality of power amplifiers (e.g., two PAs) so that individual power amplifiers can provide superior performance relative to a single power amplifier handling a multiple of the power load (e.g., double) at the same supply voltage.

In block 1220, the wireless communications configuration combines the amplified signals for output. The combined signals can be directed to one or more antennas for transmission. The combiner can include impedance matching circuits. In some embodiments, combining amplified signals from two or more amplification paths can reduce noise and/or increase signal-to-noise of the output signal due to cancellation of random noise of each amplification path when combined.

Example Modules and Devices

Figure 13:
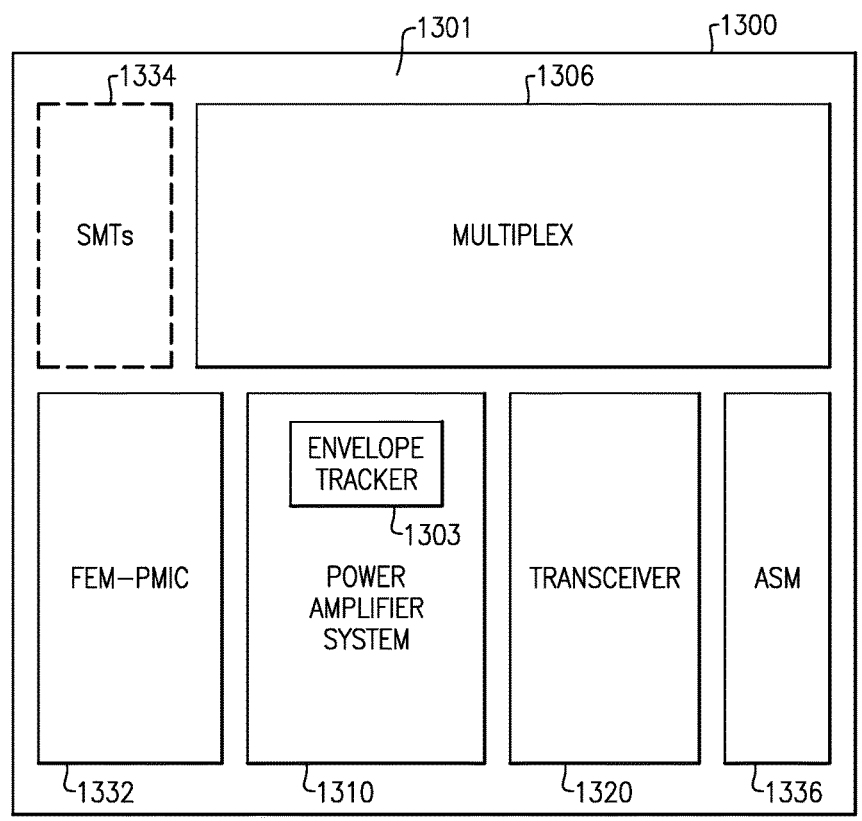
FIG. 13 illustrates that in some embodiments, some or all the wireless communications configurations disclosed herein can be implemented, wholly or partially, in a module.

FIG. 13 illustrates that in some embodiments, some or all the wireless communications configurations disclosed herein (e.g., those shown in FIGS. 1-10) can be implemented, wholly or partially, in a module. Such a module can be, for example, a front-end module (FEM). In the example of FIG. 13, a module 1300 can include a packaging substrate 1301, and a number of components can be mounted on such a packaging substrate 1301. For example, a front end module power module integrated circuit (FEM-PMIC) component 1332, a power amplifier system 1310 which includes an envelope tracker 1303 (examples of which are described herein with reference to FIGS. 1-10), a transceiver 1320, and a multiplexer assembly 1306 can be mounted and/or implemented on and/or within the packaging substrate 1301. Other components such as a number of SMT devices 1334 and an antenna switch module (ASM) 1336 can also be mounted on the packaging substrate 1301. Although all of the various components are depicted as being laid out on the packaging substrate 1301, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 14:
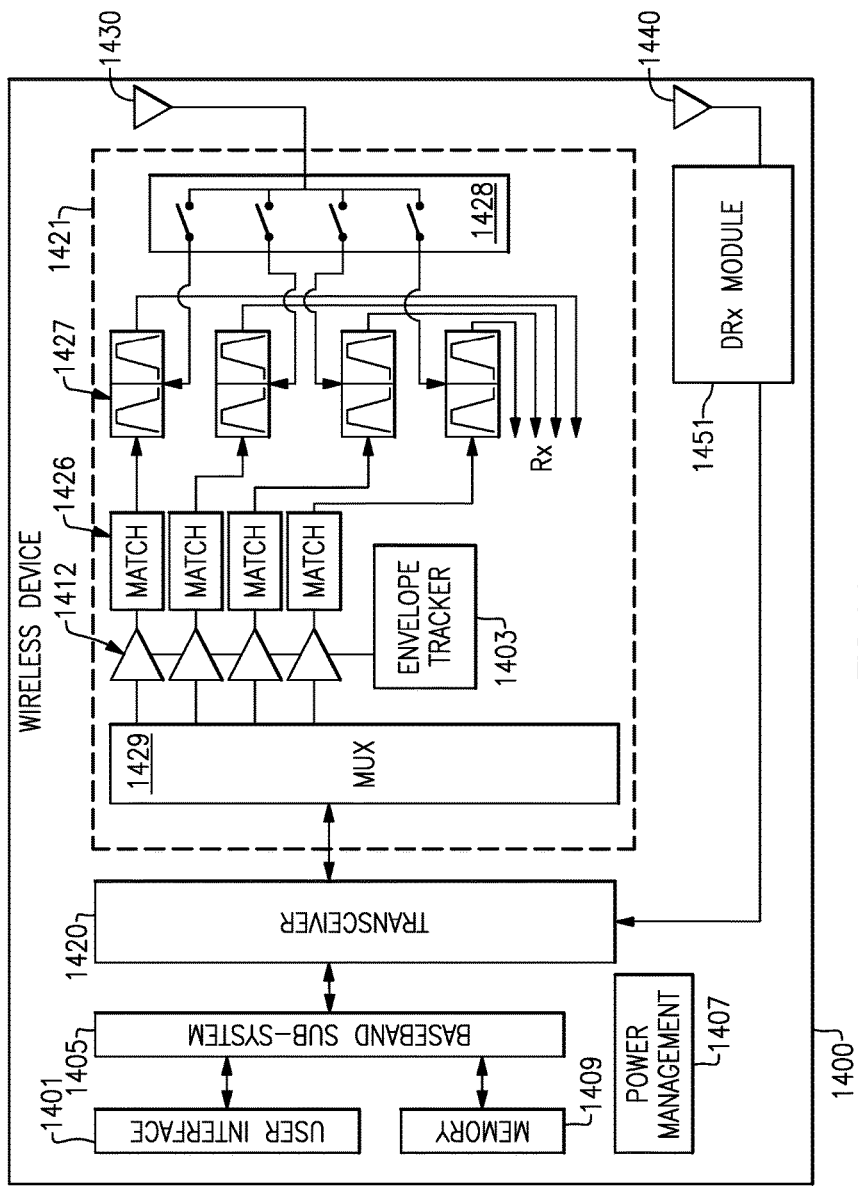
FIG. 14 illustrates an example wireless device having one or more advantageous features described herein.

FIG. 14 illustrates an example wireless device 1400 having one or more advantageous features described herein. In the context of a module having one or more features as described herein, such a module can be generally depicted by a dashed box 1421, and can be implemented as, for example, a front-end module (FEM) and a diversity receiver (DRx) module 1451 (which can be implemented within a diversity receiver system) coupled to a diversity antenna 1440 and a transceiver 1420.

The wireless device 1400 can include power amplifiers (PAs) 1412 that receive their respective RF signals from the transceiver 1420 that can be configured and operated in known manners to generate RF signals to be amplified and transmitted, and to process received signals. The transceiver 1420 is shown to interact with a baseband sub-system 1405 that is configured to provide conversion between data and/or voice signals suitable for a user and RF signals suitable for the transceiver 1420. The transceiver 1420 can also be in communication with a power management component 1407 that is configured to manage power for the operation of the wireless device 1400. Such power management can also control operations of the baseband sub-system 1405 and the modules 1421, 1451.

The baseband sub-system 1405 is shown to be connected to a user interface 1401 to facilitate various input and output of voice and/or data provided to and received from the user. The baseband sub-system 1405 can also be connected to a memory 1409 that is configured to store data and/or instructions to facilitate the operation of the wireless device, and/or to provide storage of information for the user.

In the example wireless device 1400, outputs of the PAs 1412 are shown to be matched (via respective output match circuits 1426) and routed to their respective diplexers 1427. Such amplified and filtered signals can be routed to an antenna 1430 (or multiple antennas) through an antenna switch 1428 for transmission. In some embodiments, the diplexers 1427 can allow transmit and receive operations to be performed simultaneously using a common antenna (e.g., 1430). Received signals are shown to be routed to "Rx" paths (not shown) that can include, for example, a low-noise amplifier (LNA). In some implementations, the receive paths also include one or more filters (not shown). The front end module 1421 can include a multiplexer 1429 configured to direct signals from the transceiver 1429 to the PAs 1412.

The wireless device 1400 includes an envelope tracker 1403 configured to generate envelope tracking signals to power the power amplifiers 1412. The envelope tracker 1403 can be configured as described herein. For example, the envelope tracker can include two or more fast error amplifiers that can generate respective envelope tracking signals to be sent to corresponding two or more power amplifiers 1412. This can increase the frequency of operation, the power, the linearity, and the like for the wireless device 1400 when operating to deliver high bandwidth signals (e.g., at least about 40 MHz) and/or when operating to communicate cellular or other wireless signals based on LTE-Advanced protocols. The envelope tracker 1403 can include a plurality of fast error amplifiers and each power amplifier 412 can include a plurality of amplification paths that receive corresponding envelope tracking signals from the plurality of fast error amplifiers, as described herein.

The wireless device also includes a diversity antenna 1440 and a diversity receiver module 1451 that receives signals from the diversity antenna 1440. The diversity receiver module 1451 transmits received signals to the transceiver 1410. In some embodiments, a diplexer or triplexer can be included between the diversity antenna 1440 and the diversity receiver module 1451 and/or between the primary antenna 1430 and the front end module 1421.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Additional Embodiments

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some embodiments may be described with reference to equations, algorithms, and/or flowchart illustrations. Each equation, algorithm, block, or step of a flowchart, and combinations thereof, may be implemented by hardware, firmware, and/or software including one or more computer program instructions embodied in computer-readable program code logic. It will be understood that each equation, algorithm, and/or block in flowchart illustrations, and combinations thereof, may be implemented by special purpose hardware that perform the specified functions or steps. The various functions disclosed herein may be embodied in application-specific circuitry (e.g., ASICs or FPGAs).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless communications system comprising:
   an envelope tracking system including a plurality of fast error amplifiers, the envelope tracking system configured to generate a corresponding plurality of envelope tracking signals by combining individual outputs of individual fast error amplifiers with a regulated supply voltage from a DC-DC converter;
   a plurality of power amplifiers connected in parallel between a signal input terminal and a signal output terminal, individual power amplifiers coupled to individual fast error amplifiers to receive a corresponding envelope tracking signal, the plurality of power amplifiers configured to amplify a portion of an input signal received at the input terminal so that a power load is divided among the plurality of power amplifiers; and
   a combiner configured to generate an output signal by combining amplified signals from the plurality of power amplifiers, the combiner including a harmonic trap to reduce harmonics in the output signal.

2. The system of claim 1 wherein the envelope tracking system includes an LC combiner to combine the regulated supply voltage with signals from the plurality of fast error amplifiers.

3. The system of claim 1 wherein the plurality of power amplifiers includes one or more cascode amplifiers.

4. The system of claim 1 further comprising an input impedance matching component disposed between the signal input terminal and the plurality of power amplifiers.

5. The system of claim 1 further comprising an output impedance matching component disposed between the plurality of power amplifiers and the signal output terminal.

6. The system of claim 1 wherein the combiner is a class E combiner.

7. The system of claim 1 wherein each fast error amplifier includes a class AB structure to generate the envelope tracking signal.

8. The system of claim 1 wherein each fast error amplifier is configured to receive a unique regulated supply voltage.

9. The system of claim 8 wherein the unique regulated supply voltages are provided by individual DC-DC converters.

10. The system of claim 1 wherein the combiner includes an impedance matching network.

11. The system of claim 1 wherein the combiner is further configured to split the combined amplified signal for transmission on a plurality of antennas.

12. A radio-frequency (RF) module comprising:
    a packaging substrate configured to receive a plurality of components; and
    a power amplifier system implemented on the packaging substrate, the power amplifier system including an envelope tracking system including a plurality of fast error amplifiers, the envelope tracking system configured to generate a corresponding plurality of envelope tracking signals by combining individual outputs of individual fast error amplifiers with a regulated supply voltage from a DC-DC converter, the power amplifier system also including a plurality of power amplifiers connected in parallel between a signal input terminal and a signal output terminal, individual power amplifiers coupled to individual fast error amplifiers to receive a corresponding envelope tracking signal, the plurality of power amplifiers configured to amplify a portion of an input signal received at the input terminal so that a power load is divided among the plurality of power amplifiers, and the power amplifier system also including a combiner configured to generate an output signal by combining amplified signals from the plurality of power amplifiers, and the power amplifier system also including a plurality of DC-DC converters configured to generate corresponding regulated supply voltages to be combined with signals from individual fast error amplifiers to generate a plurality of different envelope tracking signals.

13. A wireless device comprising:
    a transceiver configured to generate a radio-frequency (RF) signal;
    a front-end module (FEM) in communication with the transceiver, the FEM including a packaging substrate configured to receive a plurality of components, the FEM further including a power amplifier system implemented on the packaging substrate, the power amplifier system including an envelope tracking system including a plurality of fast error amplifiers, the envelope tracking system configured to generate a corresponding plurality of envelope tracking signals by combining individual outputs of individual fast error amplifiers with a regulated supply voltage from a DC-DC converter, a plurality of power amplifiers connected in parallel between a signal input terminal and a signal output terminal, individual power amplifiers coupled to individual fast error amplifiers to receive a corresponding envelope tracking signal, and a combiner configured to generate an amplified RF signal by combining amplified signals from the plurality of power amplifiers, and the power amplifier system also including a plurality of DC-DC converters configured to generate corresponding regulated supply voltages to be combined with signals from individual fast error amplifiers to generate a plurality of different envelope tracking signals; and
    an antenna in communication with the FEM, the antenna configured to transmit the amplified RF signal received from the power amplifier system.

14. The wireless device of claim 13 wherein the amplified RF signal has a bandwidth of at least 40 MHz.

15. The wireless device of claim 13 wherein the amplified RF signal is delivered to the antenna with a power of at least 31 dBm.

16. The wireless device of claim 13 wherein the FEM is configured to perform uplink carrier aggregation.

17. The wireless device of claim 13 wherein the combiner comprises a transformer-based combiner that couples amplified signals to respective output paths on an output portion of the combiner, the amplified signals combined to provide the amplified RF signal.

18. The wireless device of claim 17 wherein the power amplifier system is configured to provide intra-band carrier aggregation.

* * * * *